United States Patent

Soga

(10) Patent No.: US 9,806,782 B2
(45) Date of Patent: Oct. 31, 2017

(54) PHASE SHIFT CIRCUIT, PHASED ARRAY DEVICE, AND PHASE CONTROL METHOD

(71) Applicant: FUJITSU LIMITED, Kawasaki-shi, Kanagawa (JP)

(72) Inventor: Ikuo Soga, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/422,875

(22) Filed: Feb. 2, 2017

(65) Prior Publication Data

US 2017/0237475 A1    Aug. 17, 2017

(30) Foreign Application Priority Data

Feb. 17, 2016  (JP) ................................ 2016-027824

(51) Int. Cl.

| H04B 1/04 | (2006.01) |
|---|---|
| H04B 7/06 | (2006.01) |
| H03F 3/193 | (2006.01) |
| H03F 1/56 | (2006.01) |
| H03K 5/01 | (2006.01) |
| H03K 5/00 | (2006.01) |

(52) U.S. Cl.
CPC ................. *H04B 7/06* (2013.01); *H03F 1/56* (2013.01); *H03F 3/193* (2013.01); *H03K 5/01* (2013.01); *H03F 2200/222* (2013.01); *H03F 2200/387* (2013.01); *H03F 2200/451* (2013.01); *H03K 2005/00286* (2013.01)

(58) Field of Classification Search
CPC ... H04B 7/06; H03F 1/56; H03F 3/193; H03F 2200/451; H03F 2200/222; H03F 2200/387; H03K 5/01

USPC ......................................................... 455/103
See application file for complete search history.

(56) References Cited

U.S. PATENT DOCUMENTS

| 5,283,587 | A | * | 2/1994 | Hirshfield | ............ | H01Q 21/064 |
|---|---|---|---|---|---|---|
| | | | | | | 342/361 |
| 7,358,806 | B2 | * | 4/2008 | Burns | ..................... | H03F 3/211 |
| | | | | | | 330/124 R |
| 8,736,336 | B2 | * | 5/2014 | Kishimoto | ................ | H01P 1/18 |
| | | | | | | 327/254 |
| 2008/0144689 | A1 | * | 6/2008 | Crouch | .................... | H01Q 3/26 |
| | | | | | | 372/57 |

FOREIGN PATENT DOCUMENTS

| JP | 2003-133906 | 5/2003 |
|---|---|---|
| JP | 2003-229738 | 8/2003 |
| JP | 2011-010192 | 1/2011 |

* cited by examiner

*Primary Examiner* — Sanh Phu
(74) *Attorney, Agent, or Firm* — Fujitsu Patent Center

(57) ABSTRACT

A phase shift circuitry includes: a signal generation circuitry that receives an input signal, and outputs four signals different in phase from each other by 90 degrees based on the input signal, the four signals includes a first signal and a second signal; four variable amplifier circuitry that each includes a transistor, and amplify the four signals individually, with amplification factors based on control voltages supplied to gates of the transistors, the four variable amplifier circuitry include a first amplifier amplifies the first signal by a first control voltage and a second amplifier amplifies the second signal by a second control voltage; a synthetic circuitry that synthesizes output signals of the four variable amplifier circuitry, and outputs a synthesized signal; and a control circuitry supplies voltages, that are equal to or higher than the gate threshold value, to the first amplifier and the second amplifier.

6 Claims, 9 Drawing Sheets

FIG. 6

| θ (°) | Vg1(V) | Vg2(V) | Vg3(V) | Vg4(V) |
|---|---|---|---|---|
| 0 | 0.38 | 0 | 0.38 | 0.38 |
| 14 | 0.35 | 0 | 0.38 | 0.35 |
| 34 | 0.32 | 0 | 0.38 | 0.32 |
| 56 | 0.38 | 0.32 | 0.32 | 0 |
| 76 | 0.38 | 0.35 | 0.35 | 0 |
| 90 | 0.38 | 0.38 | 0.38 | 0 |
| 104 | 0.35 | 0.38 | 0.35 | 0 |
| 124 | 0.32 | 0.38 | 0.32 | 0 |
| 146 | 0 | 0.32 | 0.38 | 0.32 |
| 166 | 0 | 0.35 | 0.38 | 0.35 |
| 180 | 0 | 0.38 | 0.38 | 0.38 |
| 194 | 0 | 0.35 | 0.35 | 0.38 |
| 214 | 0 | 0.32 | 0.32 | 0.38 |
| 236 | 0.32 | 0.38 | 0 | 0.32 |
| 256 | 0.35 | 0.38 | 0 | 0.35 |
| 270 | 0.38 | 0.38 | 0 | 0.38 |
| 284 | 0.38 | 0.35 | 0 | 0.35 |
| 304 | 0.38 | 0.32 | 0 | 0.32 |
| 326 | 0.32 | 0 | 0.32 | 0.38 |
| 346 | 0.35 | 0 | 0.35 | 0.38 |
| 360 | 0.38 | 0 | 0.38 | 0.38 |

FIG. 7

| θ (°) | Vg1(V) | Vg2(V) | Vg3(V) | Vg4(V) |
|---|---|---|---|---|
| 0 | 0.38 | 0 | 0 | 0 |
| 14 | 0.35 | 0 | 0.17 | 0 |
| 34 | 0.32 | 0 | 0.27 | 0 |
| 56 | 0.27 | 0 | 0.32 | 0 |
| 76 | 0.17 | 0 | 0.35 | 0 |
| 90 | 0 | 0 | 0.38 | 0 |
| 104 | 0 | 0.17 | 0.35 | 0 |
| 124 | 0 | 0.27 | 0.32 | 0 |
| 146 | 0 | 0.32 | 0.27 | 0 |
| 166 | 0 | 0.35 | 0.17 | 0 |
| 180 | 0 | 0.38 | 0 | 0 |
| 194 | 0 | 0.35 | 0 | 0.17 |
| 214 | 0 | 0.32 | 0 | 0.27 |
| 236 | 0 | 0.27 | 0 | 0.32 |
| 256 | 0 | 0.17 | 0 | 0.35 |
| 270 | 0 | 0 | 0 | 0.38 |
| 284 | 0.17 | 0 | 0 | 0.35 |
| 304 | 0.27 | 0 | 0 | 0.32 |
| 326 | 0.32 | 0 | 0 | 0.27 |
| 346 | 0.35 | 0 | 0 | 0.17 |
| 360 | 0.38 | 0 | 0 | 0 |

PHASE SHIFT CIRCUIT, PHASED ARRAY DEVICE, AND PHASE CONTROL METHOD

CROSS-REFERENCE TO RELATED APPLICATION

This application is based upon and claims the benefit of priority of the prior Japanese Patent Application No. 2016-027824, filed on Feb. 17, 2016, the entire contents of which are incorporated herein by reference.

FIELD

The embodiments discussed herein are related to a phase shift circuit, a phased array device, and a phase control method.

BACKGROUND

A phased array device outputs radio waves different in phase from each other from a plurality of antennas adjacent to each other, and thereby transmits the radio waves in one direction. Such phased array devices are expected to be applied to vehicle-mounted radars and apparatuses for a fifth generation mobile communication system in the future.

A phased array device uses phase shift circuits that adjust the phases of radio waves output from a plurality of antennas. In order to shift the phase of an input signal (phase shift) by a specified amount of phase shift, a phase shift circuit adjusts the amplitudes of two signals different in phase from each other by 90 degrees in respective variable amplifier circuits according to the amount of phase shift, and synthesizes the two signals adjusted in amplitude. A signal having a phase corresponding to a ratio between the amplitudes is thereby output.

However, the existing phase shift circuit may cause phase deviation before synthesizing the two signals in cases of small degrees of amplification (amplification factor) in the variable amplifier circuits. Therefore, the phase shift by the desired amount of phase shift may not be performed, so that an error may occur in output phase.

The followings are reference documents.
[Document 1] Japanese Laid-open Patent Publication No. 2003-133906,
[Document 2] Japanese Laid-open Patent Publication No. 2011-10192, and
[Document 3] Japanese Laid-open Patent Publication No. 2003-229738

SUMMARY

According to an aspect of the embodiments, a phase shift circuitry includes: a signal generation circuitry that receives an input signal, and outputs four signals different in phase from each other by 90 degrees based on the input signal, the four signals includes a first signal and a second signal of which phase is differ from the first signal by 180 degree; four variable amplifier circuitry that each includes a transistor, and amplify the four signals individually, with amplification factors based on control voltages supplied to gates of the transistors, the four variable amplifier circuitry include a first amplifier amplifies the first signal by a first control voltage and a second amplifier amplifies the second signal by a second control voltage; a synthetic circuitry that synthesizes output signals of the four variable amplifier circuitry, and outputs a synthesized signal; and a control circuitry that determines the first control voltage and the second control voltage based on an amount of phase shift to shift a phase of the input signal, wherein when both of the first control voltage and the second control voltage are lower than a gate threshold value of the transistors, the control circuitry supplies voltages, that are equal to or higher than the gate threshold value, to the first amplifier and the second amplifier as the first control voltage and the second control voltage.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a diagram of an example of table data illustrating control voltages associated with amounts of phase shift;

FIG. 7 is a diagram illustrating an example of table data set without a value Vth being considered;

DESCRIPTION OF EMBODIMENT

A mode for carrying out the present technology will hereinafter be described with reference to the drawings.

Figure 1:
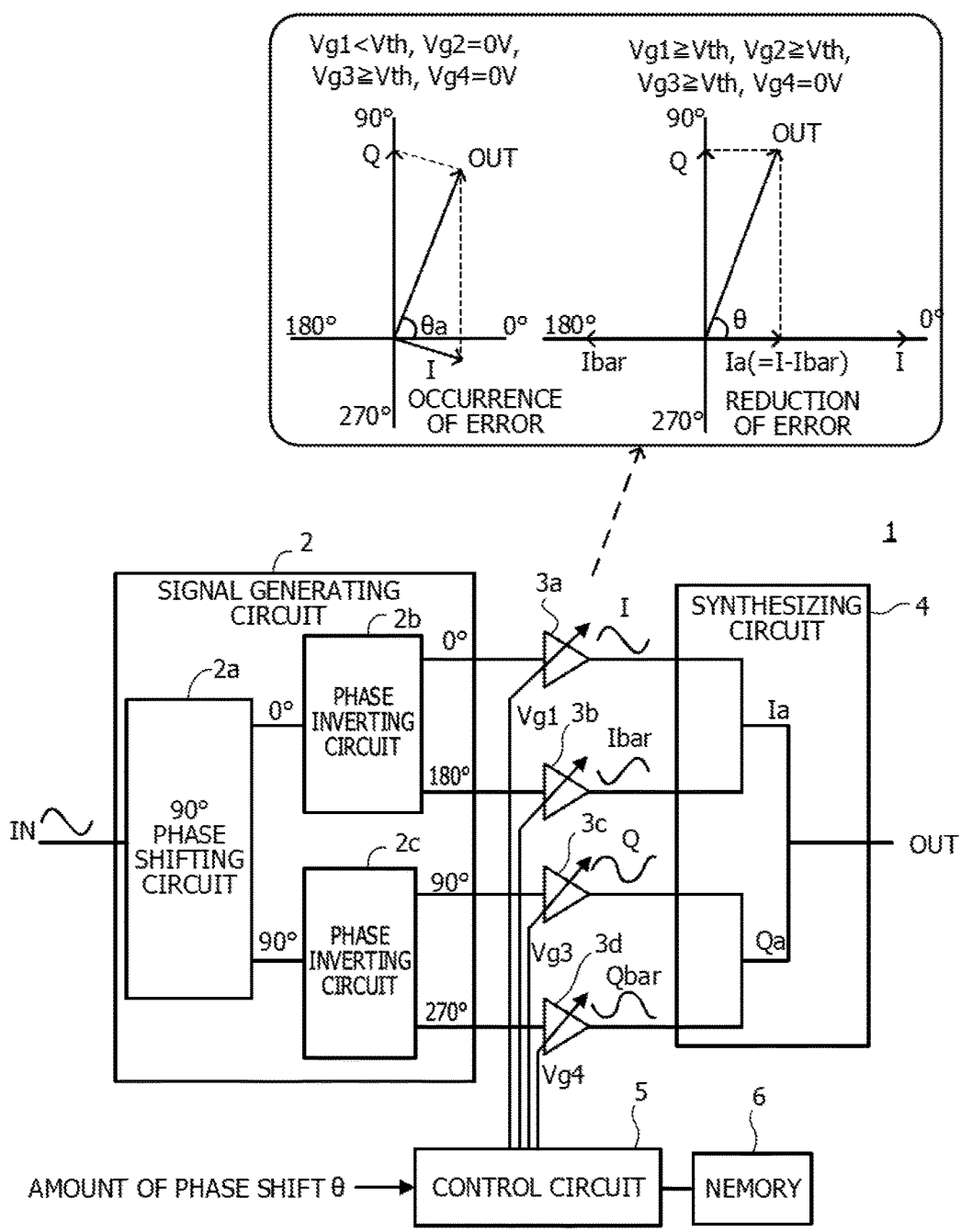
FIG. 1 is a diagram illustrating an example of a phase shift circuit according to a present embodiment.

FIG. 1 is a diagram illustrating an example of a phase shift circuit according to a present embodiment.

A phase shift circuit 1 includes a signal generating circuit 2, four variable amplifier circuits 3a, 3b, 3c, and 3d, a synthesizing circuit 4, a control circuit 5, and a memory 6.

The signal generating circuit 2 receives an input signal IN, and outputs four signals that differ in phase from each other by 90 degrees (hereinafter "degrees" will be denoted as "°") based on the input signal IN. The input signal IN is, for example, a signal having a high frequency in a millimeter waveband or the like. The signal generating circuit 2, for example, includes a 90° phase shift circuit 2a and phase inverting circuits 2b and 2c.

The 90° phase shift circuit 2a outputs a signal obtained by shift the phase of the input signal IN by 90°. In addition, the 90° phase shift circuit 2a outputs a signal having the same phase as the input signal IN (signal resulting from a 0° shift).

The phase inverting circuit 2b receives the signal having the same phase as the input signal IN, the signal having the same phase as the input signal IN being one of the two signals output from the 90° phase shift circuit 2a, and outputs a signal obtained by inverting the phase of the signal having the same phase as the input signal IN (180° shift). The phase inverting circuit 2b also outputs a signal having the same phase as the input signal IN.

The phase inverting circuit 2c receives the signal shifted by 90°, the signal shifted by 90° being the other of the two signals output from the 90° phase shift circuit 2a, and outputs a signal obtained by inverting the phase of the signal shifted by 90° (180° shift). The phase inverting circuit 2c also outputs a signal having the same phase as the signal obtained by shift the phase of the input signal IN by 90°.

The four signals that differ in phase from each other by 90° are thereby generated.

Incidentally, the 90° phase shift circuit 2a and the phase inverting circuit 2b may be implemented by using two transmission lines having different line lengths, for example. In the 90° phase shift circuit 2a, for example, the line lengths are adjusted so as to produce a phase delay of 90° in one transmission line with respect to the other transmission line.

The variable amplifier circuits 3a to 3d each include a transistor. The variable amplifier circuits 3a to 3d amplify the four respective signals output from the signal generating circuit 2 with amplification factors based on control voltages Vg1, Vg2, Vg3, and Vg4 supplied to the gates of the transistors.

In the following, the output signal of the variable amplifier circuit 3a will be referred to as a signal I, the output signal of the variable amplifier circuit 3b will be referred to as a signal Ibar, the output signal of the variable amplifier circuit 3c will be referred to as a signal Q, and the output signal of the variable amplifier circuit 3d will be referred to as a signal Qbar. In addition, suppose that the phase of the signal I is 0°, that the phase of the signal Ibar is 180°, that the phase of the signal Q is 90°, and that the phase of the signal Qbar is 270°.

Incidentally, a circuit example of the variable amplifier circuits 3a to 3d will be described later (see FIG. 2).

The synthesizing circuit 4 synthesizes the signals I, Ibar, Q, and Qbar output from the four variable amplifier circuits 3a to 3d, and outputs a synthesized signal. In the example of the phase shift circuit 1 of FIG. 1, the synthesizing circuit 4 first generates a signal Ia by synthesizing the signals I and Ibar, and generates a signal Qa by synthesizing the signals Q and Qbar. Then, the synthesizing circuit 4 outputs a signal OUT obtained by synthesizing the signals Ia and Qa. The synthesizing circuit 4 may be implemented by coupling a plurality of transmission lines, for example.

The control circuit 5 generates the control voltages Vg1 to Vg4 based on an amount of phase shift θ with respect to the input signal IN, and supplies the control voltages Vg1 to Vg4 to the variable amplifier circuits 3a to 3d.

The memory 6, for example, stores digital values of the control voltages Vg1 to Vg4 corresponding to the amount of phase shift θ.

Incidentally, in cases of low control voltages Vg1 to Vg4 (in cases of low amplification factors), the signals I, Ibar, Q, and Qbar may deviate from the above-described phases (0°, 90°, 180°, and 270°.

A left side graph of two graphs provided on the upper side of FIG. 1 illustrates the amplitudes and phases of the signals I, Q, and OUT as vectors in a case where the control voltage Vg1 is lower than a value Vth, the control voltages Vg2 and Vg4 are 0 V, and the control voltage Vg3 is equal to or higher than the value Vth.

The value Vth is a gate threshold value of the transistors included in the variable amplifier circuits 3a to 3d.

When the control voltages Vg1 to Vg4 are under conditions as described above, the phase of the signal I deviates from 0° as illustrated in FIG. 1, for example. Because the control voltages Vg2 and Vg4 are 0 V, the amplitudes of the signal Ibar and the signal Qbar are zero. The synthesizing circuit 4 therefore synthesizes the signal I and the signal Q. However, because of the above-described deviation of the phase of the signal I, the phase of the signal OUT (amount of phase shift θa) is a value different from the specified amount of phase shift θ. For example, an error occurs in the output phase.

Accordingly, the control circuit 5 supplies control voltages equal to or higher than the value Vth to two of the variable amplifier circuits 3a to 3d such that a difference value between the amplitudes after amplification of two signals different in phase by 180 degrees among the signals I, Ibar, Q, and Qbar corresponds to an amplitude value for obtaining the amount of phase shift θ.

The right side graph of the two graphs provided on the upper side of FIG. 1 illustrates the amplitudes and phases of the signals I, Ibar, Q, Ia, and OUT as vectors when the control voltages Vg1, Vg2, and Vg3 are equal to or higher than the value Vth and the control voltage Vg4 is 0 V.

Under such conditions, the signals I, Ibar, and Q are obtained by amplification with amplification factors based on the control voltages Vg1, Vg2, and Vg3 equal to or higher than the value Vth. There is thus a small phase deviation. The control circuit 5 determines the control voltages Vg1 and Vg2 such that a difference value between the amplitude of the signal I and the amplitude of the signal Ibar corresponds to the amplitude value of the signal Ia for obtaining the amount of phase shift θ.

For example, the control circuit 5 sets the control voltage Vg1 to a maximum settable value, and determines the control voltage Vg2 such that the difference value between the amplitude of the signal I and the amplitude of the signal Ibar is the amplitude value of the signal Ia for obtaining the amount of phase shift θ.

Incidentally, the amplitude value of the signal Ia for obtaining the amount of phase shift θ is determined in relation to the amplitude value of the signal Qa. For example, supposing that the amplitude value of the signal Qa is one, the amplitude value of the signal Ia for obtaining an amount of phase shift θ of 45° is the same, that is, one. In addition, supposing that the amplitude value of the signal Qa is one, the amplitude value of the signal Ia for obtaining an amount of phase shift θ of 60° is one divided by the square root of three.

In addition, a control voltage equal to or higher than the value Vth is supplied to one of the variable amplifier circuits 3c and 3d (variable amplifier circuit 3c in the example of FIG. 1) such that the amplitude after amplification of one of the signal Q and the signal Qbar (signal Q in the example of FIG. 1) also corresponds to the amplitude value for obtaining the amount of phase shift θ. In addition, a control voltage of 0 V is supplied to the other of the variable amplifier circuits 3c and 3d (variable amplifier circuit 3d in the example of FIG. 1) that amplifies the other of the signal Q and the signal Qbar (signal Qbar in the example of FIG. 1).

The signals Ia and Qa generated as described above have small phase deviations. Thus, when the synthesizing circuit 4 synthesizes the signal Ia and the signal Qa (corresponding to the signal Q because the amplitude of the signal Qbar in the example of FIG. 1 is zero), the signal OUT having a small error from the specified amount of phase shift θ is obtained. For example, the error in the output phase may be reduced.

An example of the variable amplifier circuit 3a will be described in the following. The variable amplifier circuits 3b to 3d are also implemented by a similar circuit.

[Example of Variable Amplifier Circuit 3a]

Figure 2:
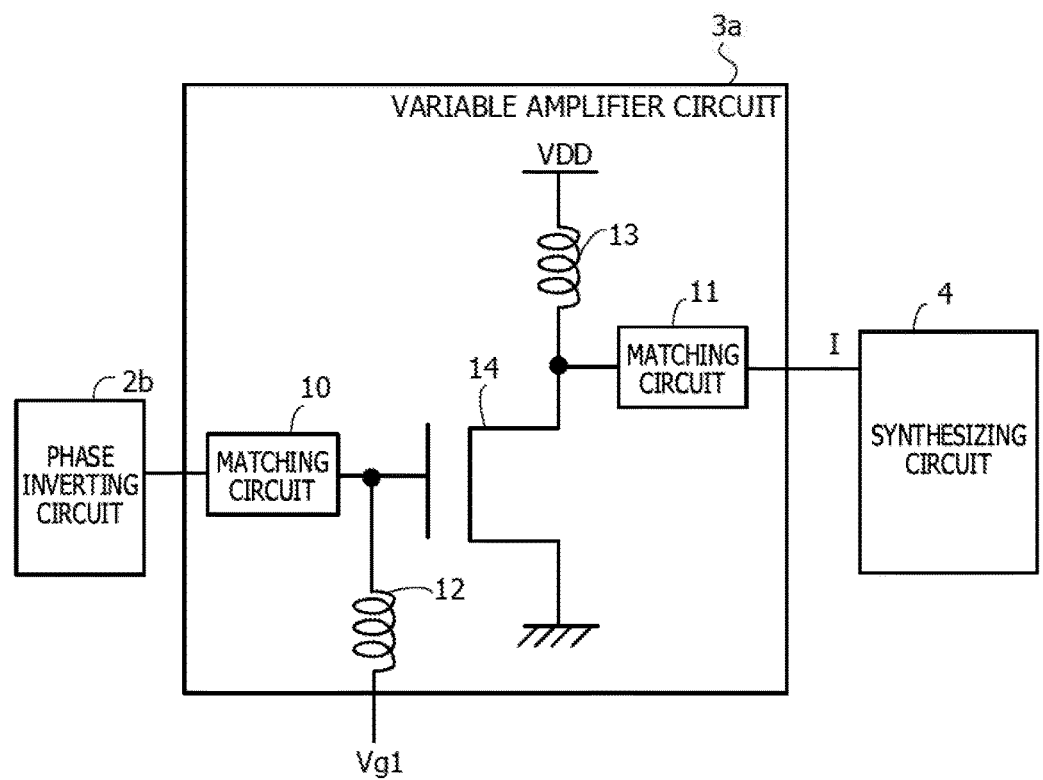
FIG. 2 is a circuit diagram illustrating an example of a variable amplifier circuit.

FIG. 2 is a circuit diagram illustrating an example of a variable amplifier circuit.

The variable amplifier circuit 3a includes matching circuits 10 and 11, inductors 12 and 13, and a transistor 14 as an n-channel metal-oxide semiconductor field effect transistor (MOSFET).

The matching circuit 10 is coupled between the phase inverting circuit 2b and the gate of the transistor 14. The matching circuit 10 performs impedance matching. The matching circuit 11 is coupled between the drain of the transistor 14 and the synthesizing circuit 4. The matching circuit 11 performs impedance matching.

One end of the inductor 12 is coupled between the matching circuit 10 and the gate of the transistor 14. Another end of the inductor 12 is supplied with the control voltage Vg1. One end of the inductor 13 is coupled between the matching circuit 11 and the drain of the transistor 14. Another end of the inductor 13 is supplied with a power supply voltage VD. The inductors 12 and 13 stop high-frequency signals from propagating to the control circuit 5 or a power supply.

The transistor 14 has a grounded source. The transistor 14 is turned on when a gate voltage becomes equal to or higher than the value Vth, which is a gate threshold value.

Figure 3:
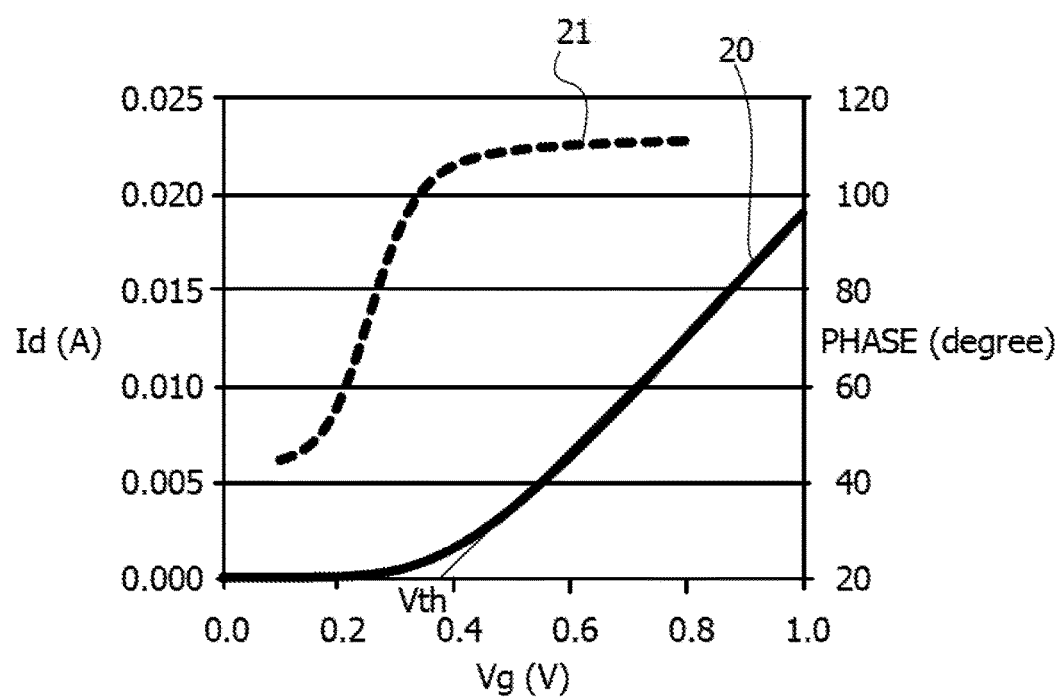
FIG. 3 is a diagram illustrating relation between gate voltage and drain current of a transistor and phase changes.

FIG. 3 is a diagram illustrating relation between gate voltage and drain current of a transistor and phase changes. An axis of abscissas indicates the gate voltage Vg (in units of V). An axis of ordinates indicates the drain current Id (in units of A) and phase (in units of degrees (°).

A waveform 20 represents a relation between the gate voltage Vg and the drain current Id. When the gate voltage Vg becomes equal to or higher than the value Vth, the drain current Id starts to flow in large amounts. When the gate voltage Vg is further increased, the drain current Id is also increased.

Therefore, increasing the control voltage Vg1 supplied to the variable amplifier circuit 3a as illustrated in FIG. 2 increases the drain current Id of the transistor 14, and may thus increase the amplitude of the signal I as the output of the variable amplifier circuit 3a. For example, the higher the control voltage Vg1, the higher an amplification factor.

A waveform 21 in FIG. 3 represents changes in the phase of the drain current Id. The phase is changed greatly when the gate voltage Vg is lower than the value Vth. The phase is stabilized when the gate voltage Vg becomes equal to or higher than the value Vth.

Figure 4:
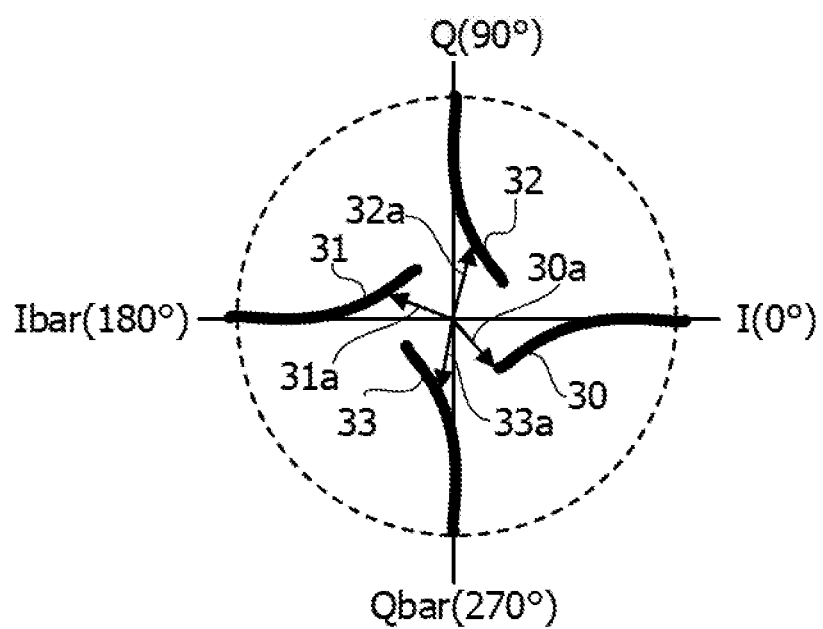
FIG. 4 is a diagram illustrating an example of relations between amplification factors and phase changes in four variable amplifier circuits.

FIG. 4 is a diagram illustrating an example of relations between amplification factors and phase changes in four variable amplifier circuits.

Waveforms 30, 31, 32, and 33 are the loci of vertices of vectors 30a, 31a, 32a, and 33a representing the signals I, Ibar, Q, and Qbar when the amplification factors are changed.

The lengths of the vectors 30a to 33a represent the amplitudes of the signals I, Ibar, Q, and Qbar. The orientations of the vectors 30a to 33a represent the phases of the signals I, Ibar, Q, and Qbar.

The phases of the signals I, Ibar, Q, and Qbar deviate when the amplification factors decrease (which corresponds to decreases in the control voltages Vg1 to Vg4). This results from the use of the control voltages Vg1 to Vg4 lower than the value Vth illustrated in FIG. 3.

Hence, the phase changes may be suppressed by making the control voltages Vg1 to Vg4 equal to or higher than the value Vth. In the case of the variable amplifier circuit 3a, deviation of the phase of the output signal I from 0° may be suppressed.

Incidentally, while the value Vth is set at the gate threshold value in the above-described example, the value Vth may be set to a value higher than the gate threshold value in order to further reduce the phase changes based on the transistor characteristics as illustrated in FIG. 3.

The following description will be made of an example of a method of phase control by the phase shift circuit 1 illustrated in FIG. 1.

[Example of Phase Control Method]

Figure 5:
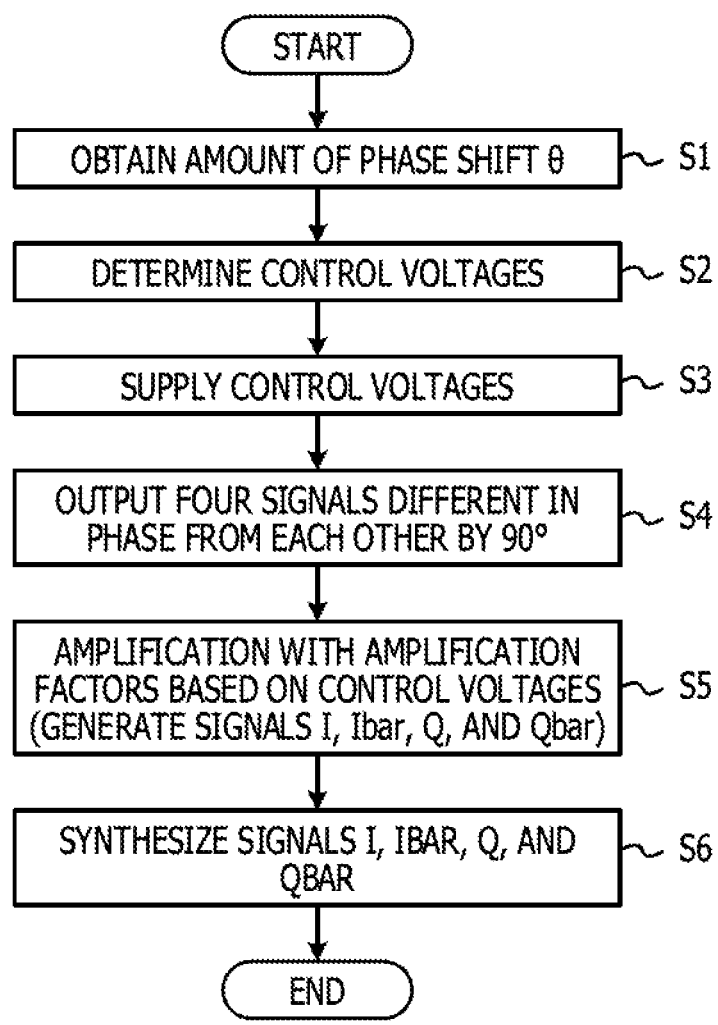
FIG. 5 is a flowchart illustrating a flow of an example of a phase control method.

FIG. 5 is a flowchart illustrating a flow of an example of a phase control method.

First, the control circuit 5 obtains an amount of phase shift θ with respect to an input signal IN (step S1). The amount of phase shift θ may, for example, be supplied from the outside of the phase shift circuit 1 or stored in the memory 6.

The control circuit 5 determines control voltages Vg1 to Vg4 based on the amount of phase shift θ (step S2).

The control circuit 5, for example, determines the control voltages Vg1 to Vg4 based on table data as in the following. Incidentally, suppose in the following that the above-described value Vth is 0.3 V, and that a maximum value of the control voltages Vg1 to Vg4 is 0.38 V.

FIG. 6 is a diagram of an example of table data illustrating control voltages associated with amounts of phase shift.

A table data 40 illustrates the values of the control voltages Vg1 to Vg4 associated with each of amounts of phase shift θ in a range of 0° to 360°. The table data 40 is, for example, stored in the memory 6.

As illustrated in FIG. 6, for each of the plurality of amounts of phase shift θ, three of the values of the control voltages Vg1 to Vg4 supplied to the variable amplifier circuits 3a to 3d are equal to or higher than the value Vth.

As an example, the signal Qa has a low amplitude for obtaining an amount of phase shift θ of 14°. Thus, a phase deviation occurs in the signal Q as described earlier when only the signal Q is amplified with a low amplification factor and the amplitude of the signal Qbar is set at zero.

Accordingly, as illustrated in FIG. 6, the control voltage Vg3 is set at 0.38 V, which is the maximum value, and the control voltage Vg4 is set at 0.35 V. The amplitude of the signal Qbar is thus higher than zero. The value of the control voltage Vg4 is adjusted such that a difference value between the amplitudes of the signal Q and the signal Qbar corresponds to the amplitude value of the signal Qa for obtaining the amount of phase shift θ of 14°.

Incidentally, the amplitude of the signal I for providing the amount of phase shift θ of 14° is produced by the control voltage Vg1 (0.35 V) higher than the value Vth (0.3 V). The amplitude of the signal Ibar may thus be zero. Therefore, the control voltage Vg2 is 0 V.

In addition, because of a low amplitude of the signal Ia for obtaining an amount of phase shift θ of 76°, for example, a phase deviation occurs in the signal I as described earlier when only the signal I is amplified with a low amplification factor and the amplitude of the signal Ibar is set to zero.

Accordingly, as illustrated in FIG. 6, the control voltage Vg1 is set at 0.38 V, which is the maximum value, and the control voltage Vg2 is set at 0.35 V. The amplitude of the signal Ibar is thus higher than zero. The value of the control voltage Vg2 is adjusted such that a difference value between the amplitudes of the signal I and the signal Ibar corresponds to the amplitude value of the signal Ia for obtaining the amount of phase shift θ of 76°.

Incidentally, the amplitude of the signal Q for providing the amount of phase shift θ of 76° is produced by the control voltage Vg3 (0.35 V) higher than the value Vth (0.3 V). The amplitude of the signal Qbar may thus be zero. Therefore, the control voltage Vg4 is 0 V.

As an example, the control circuit 5 (or a computer or the like) may generate the table data 40 as described above based on table data set without the value Vth being considered.

FIG. 7 is a diagram illustrating an example of table data set without a value Vth being considered.

A table data 41 illustrates the control voltages Vg1 to Vg4 associated with amounts of phase shift of 0° to 360°. The table data 41 is, for example, stored in the memory 6.

The control voltages Vg1 and Vg2 in the table data 41 are values that make the amplitude value of one of the signals I and Ibar an amplitude value of the signal Ia for obtaining an amount of phase shift θ. Similarly, the control voltages Vg3 and Vg4 in the table data 41 are values that make the amplitude value of one of the signals Q and Qbar an amplitude value of the signal Qa for obtaining an amount of phase shift θ.

The control circuit 5 determines whether or not one of the control voltages Vg1 and Vg2 and one of the control voltages Vg3 and Vg4 are equal to or higher than the value Vth in the table data 41 as described above.

Then, when both of the control voltages Vg1 and Vg2 are lower than the value Vth, the control circuit 5 determines the control voltages Vg1 and Vg2 that are both equal to or higher than the value Vth such that a difference value between the amplitudes of the signal I and the signal Ibar (amplitude of the signal Ia) corresponds to the amplitude value for obtaining the amount of phase shift θ. In addition, when both of the control voltages Vg3 and Vg4 are lower than the value Vth, the control circuit 5 determines the control voltages Vg3 and Vg4 that are both equal to or higher than the value Vth such that a difference value between the amplitudes of the signal Q and the signal Qbar (amplitude of the signal Qa) corresponds to the amplitude value for obtaining the amount of phase shift θ.

In the table data 41, the control voltages Vg1 to Vg4 for obtaining an amount of phase shift θ of 14°, for example, are set such that Vg1=0.35 V, Vg2=0 V, Vg3=0.17 V, and Vg4=0 V.

In this case, of the control voltages Vg1 and Vg2, the control voltage Vg1 is higher than the value Vth (0.3 V). The control circuit 5 therefore uses the control voltage Vg1 as it is. On the other hand, the control voltages Vg3 and Vg4 are both lower than the value Vth (0.3 V). The control circuit 5 therefore determines the control voltages Vg3 and Vg4 that are both equal to or higher than the value Vth such that a difference value between the amplitudes of the signal Q and the signal Qbar is the amplitude value for obtaining the amount of phase shift θ of 14°. The control circuit 5 determines that Vg3=0.38 V and Vg4=0.35 V, for example, as illustrated in FIG. 6.

Such processing is performed for each of the amounts of phase shift θ, and the table data 40 as illustrated in FIG. 6 is generated from the table data 41 illustrated in FIG. 7, for example.

The control circuit 5 may quickly determine the values of the control voltages Vg1 to Vg4 corresponding to the amount of phase shift θ by using the table data 40.

The description returns to FIG. 5. After determining the control voltages Vg1 to Vg4 in the processing of step S2, the control circuit 5 supplies the control voltages Vg1 to Vg4 to the variable amplifier circuits 3a to 3d (step S3).

Meanwhile, the signal generating circuit 2 receives the input signal IN, and outputs four signals different in phase from each other by 90°, supposing that the phase of the input signal IN is 0° (step S4).

The variable amplifier circuits 3a to 3d then generate signals I, Ibar, Q, and Qbar by amplifying the four signals output from the signal generating circuit 2 with amplification factors based on the control voltages Vg1 to Vg4 supplied from the control circuit 5. The variable amplifier circuits 3a to 3d output the signals I, Ibar, Q, and Qbar (step S5).

The synthesizing circuit 4 synthesizes the signals I, Ibar, Q, and Qbar (step S6). First, the synthesizing circuit 4 generates a signal Ia by synthesizing the signals I and Ibar, and generates a signal Qa by synthesizing the signals Q and Qbar. The synthesizing circuit 4 further obtains a signal OUT by synthesizing the signals Ia and Qa.

Incidentally, the order of the respective steps described above may be interchanged as appropriate.

The signals Ia and Qa generated as described above have small phase deviations. Thus, the signal OUT having a small error from the specified amount of phase shift θ is obtained by synthesizing the signal Ia and the signal Qa in the synthesizing circuit 4. For example, the error in the output phase may be reduced.

Figure 8:
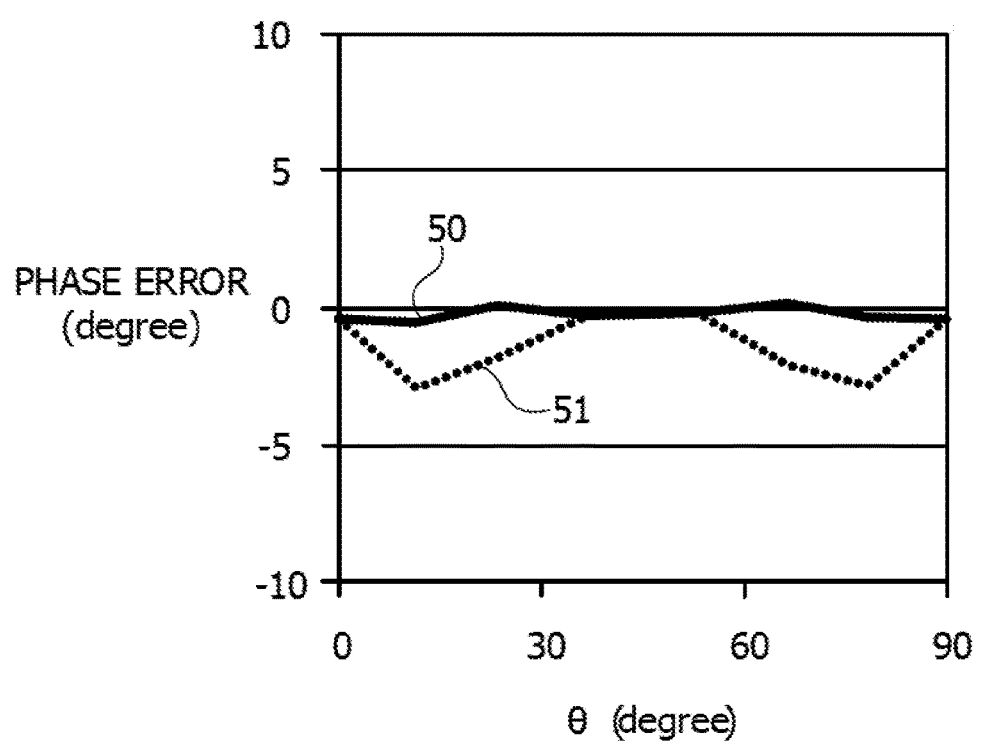
FIG. 8 is a diagram illustrating a result of measurement of phase errors with respect to an amount of phase shift.

FIG. 8 is a diagram illustrating a result of measurement of phase errors with respect to an amount of phase shift. An axis of abscissas indicates the amount of phase shift θ (in units of degrees (°). An axis of ordinates indicates the error in the output phase (phase error) (in units of degrees (°)).

A waveform 50 in FIG. 8 represents a result of measurement of the phase error with respect to the amount of phase shift θ in a case where the table data 40 illustrated in FIG. 6 is used. A waveform 51 represents a result of measurement of the phase error with respect to the amount of phase shift θ in a case where the table data 41 illustrated in FIG. 7 is used.

As indicated by the waveform 51, a maximum phase error of approximately 3° occurs in the case where the table data 41 is used. On the other hand, as indicated by the waveform 50, the phase error is reduced to approximately 0.5° in the case where the table data 40 is used.

[Phased Array Device]

Figure 9:
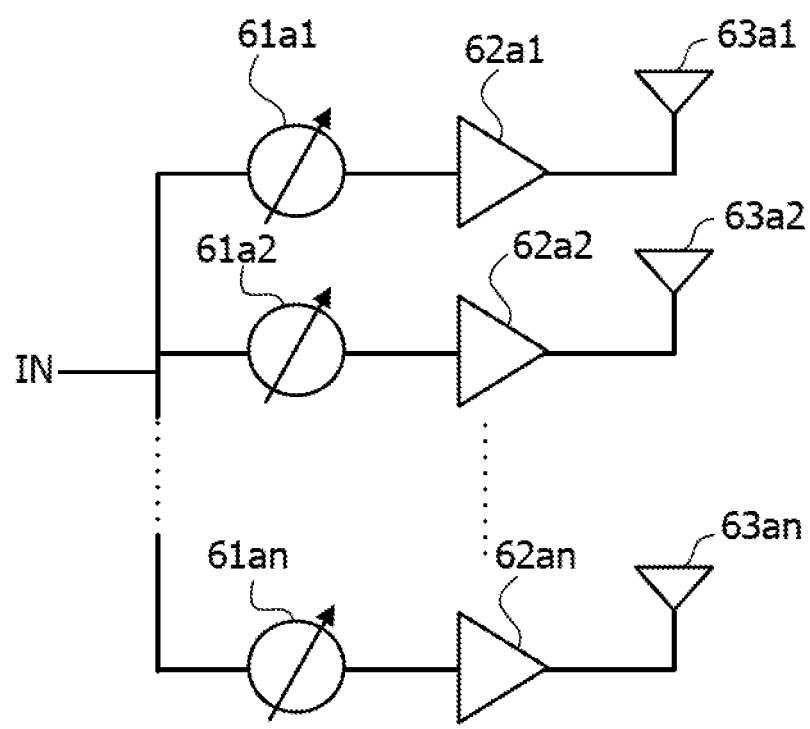
FIG. 9 is a diagram illustrating an example of a phased array device.

FIG. 9 is a diagram illustrating an example of a phased array device.

A phased array device 60 is, for example, applied to a vehicle-mounted radar, an apparatus for a mobile communication system, or the like. The phased array device 60 includes: phase shift circuits 61a1, 61a2, ..., and 61an that adjust the phase of an input signal IN; amplifier circuits 62a1, 62a2, ..., and 62an that amplify output signals of the phase shift circuits 61a1 to 61an; and antennas 63a1, 63a2, ..., and 63an.

In such a phased array device 60, the antennas 63a1 to 63an output radio waves that are based on the signals output from the amplifier circuits 62a1 to 62an and which are different in phase from each other. The radio waves are thereby transmitted in one direction.

The phase shift circuit 1 as illustrated in FIG. 1 is, for example, used as the phase shift circuits 61a1 to 61an of the phased array device 60 as described above. Because the phase shift circuit 1 may reduce the error in the output phase, it is possible to provide the phased array device 60 that may change the direction of the radio waves with high accuracy.

An aspect of a phase shift circuit, a phased array device, and a phase control method according to the present technology has been described above based on embodiment. However, these are mere examples, and are not limited to the above description.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A phase shift circuitry comprising:
   a signal generation circuitry that receives an input signal, and outputs four signals different in phase from each other by 90 degrees based on the input signal, the four signals includes a first signal and a second signal of which phase is differ from the first signal by 180 degree;
   four variable amplifier circuitry that each includes a transistor, and amplify the four signals individually, with amplification factors based on control voltages supplied to gates of the transistors, the four variable amplifier circuitry include a first amplifier amplifies the first signal by a first control voltage and a second amplifier amplifies the second signal by a second control voltage;
   a synthetic circuitry that synthesizes output signals of the four variable amplifier circuitry, and outputs a synthesized signal; and
   a control circuitry that determines the first control voltage and the second control voltage based on an amount of phase shift to shift a phase of the input signal,
   wherein when both of the first control voltage and the second control voltage are lower than a gate threshold value of the transistors, the control circuitry supplies voltages, that are equal to or higher than the gate threshold value, to the first amplifier and the second amplifier as the first control voltage and the second control voltage.

2. The phase shift circuitry according to claim 1, wherein
   the four signals further includes a third signal of which phase is differ from the first signal by 90 degree and a fourth signal of which phase is differ from the third signal by 180 degree,
   the four variable amplifier circuitry further include a third amplifier amplifies the third signal by a third control voltage and a fourth amplifier amplifies the fourth signal by a fourth control voltage,
   the control circuitry that determines the third control voltage and the fourth control voltage based on the amount of phase shift to shift the phase of the input signal, and
   when both of the third control voltage and the fourth control voltage are lower than the gate threshold value of the transistors, the control circuitry supplies voltages, that are equal to or higher than the gate threshold value, to the third amplifier and the fourth amplifier as the third control voltage and the fourth control voltage.

3. The phase shift circuitry according to claim 1, further comprising:
   a memory that stores first table data in which four values of the control voltages supplied to the four variable amplifier circuitry are associated with each of a plurality of amounts of phase shift and three of the four values are equal to or more than the gate threshold value,
   wherein the control circuitry determines the control voltages supplied to the four variable amplifier circuitry based on the first table data.

4. The phase shift circuitry according to claim 3,
   wherein the memory stores second table data storing values of the control voltages such that an amplitude value after amplification of one of the first signal and the second signal is the first amplitude value, and
   the control circuitry generates the first table data by updating the values based on a result of determination between the values of the control voltages in the second table data and the gate threshold value.

5. A phased array device comprising:
   a plurality of phase shift circuitry each including
   a signal generation circuitry that receives an input signal, and outputs four signals different in phase from each other by 90 degrees based on the input signal, the four signals includes a first signal and a second signal of which phase is differ from the first signal by 180 degree;
   four variable amplifier circuitry that each includes a transistor, and amplify the four signals individually, with amplification factors based on control voltages supplied to gates of the transistors, the four variable amplifier circuitry include a first amplifier amplifies the first signal by a first control voltage and a second amplifier amplifies the second signal by a second control voltage;
   a synthetic circuitry that synthesizes output signals of the four variable amplifier circuitry, and outputs a synthesized signal; and
   a control circuitry that determines the first control voltage and the second control voltage based on an amount of phase shift to shift a phase of the input signal,
   wherein when both of the first control voltage and the second control voltage are lower than a gate threshold value of the transistors, the control circuitry supplies voltages, that are equal to or higher than the gate threshold value, to the first amplifier and the second amplifier as the first control voltage and the second control voltage;
   a plurality of amplifier circuitry, each of the plurality of amplifier circuitry amplifies the synthesized signal output from corresponding phase shift circuitry individually; and
   a plurality of antennas, each of the plurality of antennas outputs radio waves based on amplified the synthesized signal output from corresponding the amplifier circuitry individually.

6. A phase control method comprising:
   by a signal generating circuitry, receiving an input signal, and outputting four signals different in phase from each other by 90 degrees based on the input signal;
   by four variable amplifier circuitry each including a transistor, amplifying the four signals individually, with amplification factors based on control voltages supplied to gates of the transistors;
   by a control circuitry, receiving an amount of phase shift indicating an amount of shift of a phase of the input signal, and supplying the control voltages equal to or more than a gate threshold value of the transistors to, among the four variable amplifier circuitry, a first variable amplifier circuitry amplifying a first signal among the four signals and a second variable amplifier circuitry amplifying a second signal among the four signals, the second signal being different in phase from the first signal by 180 degrees, such that a difference value between amplitudes after amplification of the first signal and the second signal corresponds to a first amplitude value for obtaining the amount of phase shift; and by a synthetic circuitry synthesizing output signals of the four variable amplifier circuitry, and outputting a synthesized signal.

* * * * *